United States Patent [19]

Pau

[11] Patent Number: 4,712,057
[45] Date of Patent: Dec. 8, 1987

[54] METHOD OF EXAMINING AND TESTING AN ELECTRIC DEVICE SUCH AS AN INTEGRATED OR PRINTED CIRCUIT

[75] Inventor: Louis F. Pau, Grand-Lancy, Switzerland

[73] Assignee: Battelle Memorial Institute, Carouge/Geneva, Switzerland

[21] Appl. No.: 705,341

[22] PCT Filed: May 22, 1984

[86] PCT No.: PCT/CH84/00081

§ 371 Date: Jan. 18, 1985

§ 102(e) Date: Jan. 18, 1985

[87] PCT Pub. No.: WO84/04819

PCT Pub. Date: Dec. 6, 1984

[30] Foreign Application Priority Data

May 25, 1983 [CH] Switzerland ............ 2842/83

[51] Int. Cl.⁴ ............................. G01R 31/02
[52] U.S. Cl. ........................ 324/73 R; 324/158 R; 250/311
[58] Field of Search ........... 324/158 D, 158 T, 158 R, 324/73 PC, 73 R, 71.3, 469, 470, 300; 250/310, 311, 370 J

[56] References Cited

U.S. PATENT DOCUMENTS

| | | |
|---|---|---|
| 3,803,413 | 4/1974 | Vanzetti et al. |
| 3,861,199 | 1/1975 | Barkhoudarian ............ 250/310 |
| 3,889,053 | 1/1975 | Lloyd et al. ............ 324/158 R |
| 4,184,110 | 1/1980 | Hinshaw ............ 324/300 |
| 4,242,635 | 12/1980 | Burns . |
| 4,326,165 | 4/1982 | Szedon ............ 324/158 R |
| 4,358,732 | 11/1982 | Johnston et al. |
| 4,417,203 | 11/1983 | Pfeiffer et al. ............ 324/71.3 |
| 4,435,806 | 3/1984 | Segers et al. ............ 324/73 R |
| 4,577,147 | 3/1986 | Frosien et al. ............ 250/311 |

FOREIGN PATENT DOCUMENTS

| | | |
|---|---|---|
| 66321 | 12/1982 | European Pat. Off. |
| 66694 | 12/1982 | European Pat. Off. |
| 2058756 | 5/1971 | France . |
| 2069152 | 8/1981 | United Kingdom . |
| 148154 | 12/1962 | U.S.S.R. ............ 324/158 D |

OTHER PUBLICATIONS

Carroll et al, "Microwave Trapped Plasma Devices Observed on a 356 HZ Sampling Oscilloscope", 9/20/79.
"Thermal Mapping of Transistors with a Laser Scanner", Sawyer et al, 11/76.
"Monolithic HgCdTe Charge Transfer Device Infrared Imaging Arrays", Chapman et al, 1/80.
Electronics, vol. 54, No. 14, Jul. 14, 1981, (Armonk, U.S.) L. Lowe "Lasers Automate PC-Board Inspection", pp. 96, 98 and 100, see Figure p. 96.
Microelectronics Journal, vol. 11, Mar./Apr. 1980, (Luton, GB) Ch. E. Jowett "Surface Analytical Techniques Applied to Electronic Components", pp. 35–40, see paragraph 5, Secondary Ion Mass Spectrometry, p. 37.

Primary Examiner—Reinhard J. Eisenzopf
Assistant Examiner—W. Burns
Attorney, Agent, or Firm—Cushman, Darby & Cushman

[57] ABSTRACT

This method is based on the radiation-matter interaction in a structure having discontinuities and where electron transport occurs in at least one layer. To this end, a stimulation signal is sent through the device under test and simultaneously at least one source of radiation sends incident radiation towards the surface of the device. The secondary radiation emitted by the device is detected together with the response of the device. The signals are compared, either individually or in combination, with a reference.

28 Claims, 5 Drawing Figures

METHOD OF EXAMINING AND TESTING AN ELECTRIC DEVICE SUCH AS AN INTEGRATED OR PRINTED CIRCUIT

BACKGROUND OF THE INVENTION

The invention relates to a non-destructive method of examining and testing an electric device such as an integrated or printed circuit, or a transducer using the same technologies. Using this method, radiation emitted by the device itself after stimulation is detected by scanning, and electric signals characteristic of the detected radiation are formed. These signals are then compared with reference signals.

A large number of existing micro-electronic devices are made by the integrated circuit technique, basically by lithography, chemical etching (photogravure) and metal-coating of slices or chips of silicon or of compounds III-V and II-VI in the periodic table of the elements. Arrays of photo-detectors are examples of such devices. These examinations can also be applied to single or multiple-layer printed circuits, chips cut from drawn bars of silica or compounds III-V and II-VI in the periodic table of the elements, or to microwave circuits obtained by methods similar to those for integrated-circuit chips.

Numerous efforts have already been devoted to automatic examination for faults in these kinds of electronic devices and transducers. Usually the examination is made by optical detection of radiation in the visible or infrared range, generated or reflected by the device. In U.S. Pat. No. 3,803,413, for example, an excitation signal (either a direct voltage or a modulated or pulse voltage) is applied to a printed circuit, and the infrared radiation emitted by the various circuit components is detected by a scanning mechanism. The radiation density at each point of the circuit is then compared with a reference so as to detect any faults associated with Joule-effect heating of the various metal coatings making up the circuit.

There are also methods using the technique of optical correlation of images by analysing the optical radiation reflected by the surface of the circuit. This applies particularly to European patent specifications Nos. 66321 and 66694.

The first of the aforementioned processes detects faults mainly relating to the dimensions of the components. Processes using reflection of optical radiation can detect faults in the geometry of the circuit or stresses occurring at the surface, e.g. as a result of distortion of the substrate or chip.

On the other hand these inspection processes cannot detect faults in the structure, inter alia at the interfaces between the various layers or faults in the substrate. Such faults are not inevitably shown by abnormal infrared radiation during transit of a given electric signal or by simple reflection or scattering of incident radiation.

It has already been proposed to use a scanning electron microscope (SEM) for forming an image by picking up electrons emitted as a result of electron scanning. This method has a number of disadvantages, particularly for production tests, since the electric devices under test have to be placed in a vacuum chamber and covered with a deposited layer of metal, which means that the process cannot be applied rapidly and systematically to a large production series. This method of irradiation cannot be used for simultaneous electric testing at speeds compatible with manufacturing rates. This kind of examination is described inter alia in U.S. Pat. No. 4,358,732 and French patent specification No. 2 058 756. In the latter document, electric pulse tests are made simultaneously and in synchronism with electron bombardment. This type of test cannot locate structural faults but only gives information about the performance of the tested circuit; it is also slow.

GB patent specification No. 2 069 152 also relates to a method of testing integrated circuits, in which the circuit is supplied with a voltage set to a value slightly higher than the marginal voltage at which faults in the circuit cause voltage deviations at the output when a logic test is applied to it. When a beam of radiation scans the surface, faults are revealed in the characteristic of the resulting photoelectric current and can thus be detected, but not located. This process does not comprise displaying faults by using the radiation re-emitted or transmitted by the circuit, and consequently no structural faults can be located.

It is known that if discontinuities are present in material excited by incident radiation, there will be physical interaction between the radiation and the discontinuities, resulting in a change in the mode of excitation at the interfaces.

When an incident beam strikes a semiconductor or an interface, it produces electron-hole pairs. If these mobile charge carriers reach or come from the p-n junction depletion region, they are swept by the junction potential, producing an external inverse current which is superposed on the current induced by the external electric test voltage. This current can be collected and amplified to obtain information about the electric state of the junctions through which it passes, or variations in the junction characteristics.

In addition, when a structure comprising a number of layers having different electric conductivity, in which electron transport occurs in at least one layer, is excited by incident radiation, the electron transport stimulates the change in the mode of excitation which occurs at the structure layer interfaces and is revealed by induced radiation (called secondary radiation). The signal response is also modified by the interaction between the radiation and the electric signal producing the electron transport.

The invention aims to take advantage of these physical phenomena in detecting faults in the structure of electronic devices at the interfaces (including interfaces between metal coatings and substrate) and some faults inside the substrates themselves.

SUMMARY OF THE INVENTION

To this end, the invention relates to a method of examining and testing an electrical element having a layered structure of material by initially: passing through the element a predetermined electrical signal. Simultaneously therewith the element is irradiated with radiation from at least one radiation source of predetermined type and known characteristics. The combination of this irradiation and electrical signal stimulates the said element by the irradiation interacting with the material of the structure of the element through which the signal is passing at discontinuties present in the structure. Scanning the element thereby detects the radiation emitted by the element owing to the stimulation of the element Electrical signals on the basis of the detected radiation are then formed and compared with reference signals.

This method can yield a large amount of information in a very short time. This information relates not only to the geometry but also to faults in the structure, particularly the micro-structure. As we shall see, the sources of excitation by radiation can be chosen inter alia according to the type of faults to be detected; a number of different sources can be used simultaneously and the secondary radiation induced by interaction between each form of incident radiation and the structure where electron transport occurs, is detected by respective detectors appropriate to the nature of the induced secondary radiation.

In the stage of the method for processing electric signals characteristic of the detected induced radiation, use is made of algorithms based on image recognition techniques, which are outside the scope of the invention and will therefore not be discussed in the following description.

BRIEF DESCRIPTION OF THE DRAWINGS

The accompanying drawings illustrate schematically, and by way of example, the performance of the method according to the invention. In the drawings.

DESCRIPTION OF PREFERRED EMBODIMENTS

Figure 1:
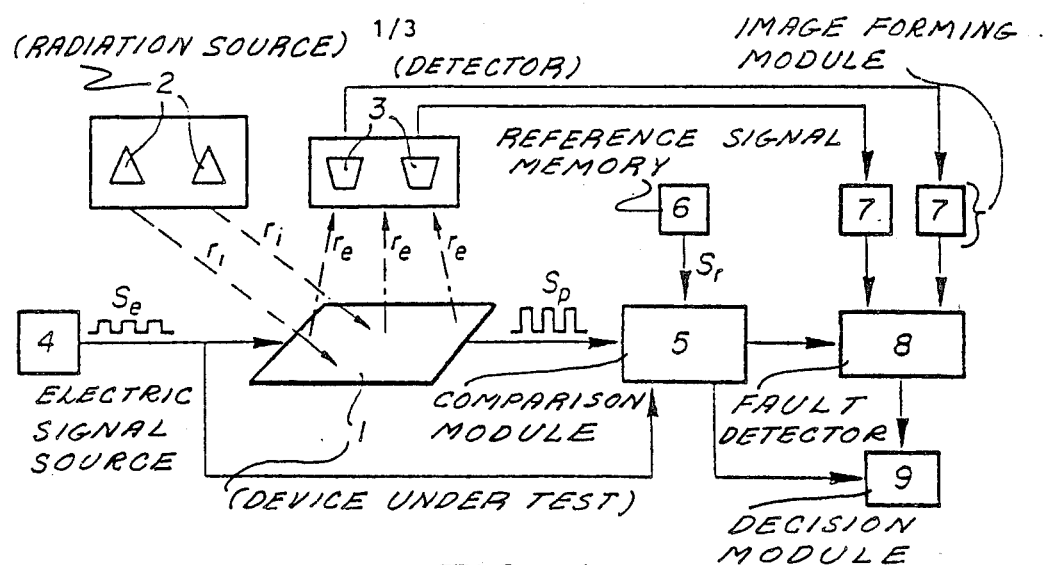
FIG. 1 is an explanatory diagram of a unit for examining an electric device, for putting the method of the invention into practice.

FIG. 1 illustrates an examination unit comprising an electric device or element 1 to be tested, at least one radiation source 2 for producing incident radiation $r_i$ directed towards the surface of the electric device element, and at least one detector 3 for picking up secondary radiation $r_e$ emitted as a result of exciting the device 1. Device 1 is connected to an electric source 4 adapted to produce a given electrical logic signal, which can be a pulse or a modulated signal, or a d.c. voltage. The output of source 4 is also connected to a comparison module 5 for comparing the logic response signal $S_p$ produced at the output of device 1 with a reference signal $S_r$ stored in a memory 6.

The detector or detectors 3 convert the picked-up secondary radiation $r_e$ into an electrical response signal that is characteristic of the detected radiation. This signal is transmitted to an image-forming module 7 after scanning of the device 1. Scanning techniques are well-known and will not be described or illustrated here. It can simply be stated that scanning of the excitation radiation from source 2 using a motor-driven rotating mirror can be used with electronic scanning of the transducer 3. The images from the image-forming modules 7 are transmitted to a module 8 which collects the information from comparison module 5 and modules 7 and detects faults in the transmitted images. The resulting information is finally transmitted to a decision module 9 which determines the extent to which the device 1 corresponds to preset standards.

The method according to the invention relates basically to the combined excitation (incident radiation $r_i$ and voltage from source 4) of device 1, and more particularly to irradiation of device 1 together with electron transport generated by the excitation signal $S_e$ from electric source 4.

The chosen radiation source or sources 2 can easily show various kinds of faults in the structure of device 1 if properly selected. Various selections are illustrated by way of example, infra. Also, in certain cases, this can be used to influence the response signal $S_p$ produced at the output of device 1.

When excitation radiation is applied to an electric device having a multi-layer structure, with electron transport occurring across at least one layer, the total radiation induced of the combined excitation by incident radiation and by the electron-transport generating signal $S_e$, is made up of the reflected part of the incident radiation, the diffracted part thereof, the radiation of the irradiated material itself induced in conjunction with the electric excitation, and the radiation of the material itself due to the electric excitation alone.

The most important part of the radiation induced by this combined excitation is the secondary radiation of the irradiated material induced in conjunction with electric excitation. This owes its existence to the interaction between radiation and material when there are discontinuities in the structure. An integrated circuit, a printed circuit, a monolithic transducer or the substrates of such circuits are mainly formed from continuous layers, i.e. discontinuous structures where interaction between radiation and material occurs when the structures are subjected to exciting radiation, due to the change in the mode of excitation at the interfaces of the structure. It is found that this change is stimulated when at least one layer is traversed by electron transport due to an excitation signal.

The method according to the invention is also applicable to stacks obtained by epitaxial growth of thin layers of alternatively one and the other of two semiconducting substrates (e.g. GaP or InP, GaAsP or InAsP). These stacks produce strong photo-luminescence when excited. The method can also be applied to gallium arsenide (GaAs) or indium phosphide (InP) semiconductors.

Various kinds of excitation by radiation, and the nature of the faults which they are adapted to detect, will now be considered with reference to examples:

EXAMPLE 1

Electric excitation is combined with irradiation by a pulsed CW ion laser (0.5 MW/cm$^2$ and 2 kA/cm$^2$). This type of excitation allows the detection of surface contamination, the presence of foreign particles, a broken array, or scratches. Either luminescence in the 0.8-3 μm infrared range produced by the density of carriers optically generated in the band-to-band radiative recombination of acceptor dopants, or modifications of the filtered light dispersed in space can be detected. The method can also detect imperfections in the crystalline structure via luminescence in the 0.8-3 μm infrared range produced by the density of positive charge carriers in the band-to-band radiative recombination of acceptor doping agents. This kind of irradiation combined with electric excitation is also of use for showing errors in alignment or errors in masks, or discontinuities in the metal coating or broken tracks or conductors. Comparing the detected image with a reference image and extracting characteristic features depending on the density of optically generated carriers, the current not flowing, or appearing at the wrong place shows these errors. Finally, this kind of radiation can show distortions in flat surfaces and discontinuities in metal coating, by comparing the image or the scanning thereof with the characteristics of a reference image.

EXAMPLE 2

Electric excitation of source 4 can be used simultaneously with a source of polarized infrared light or an infrared source for detecting imperfections in the crystal structure, or gaps or scratches in the array, ruptures in the oxide and etching of the array, by double refraction caused by the stresses induced jointly by thermal and electric excitation. This kind of excitation can also be used to detect irregular diffusion and inter-metallic formations by infra-red absorption resulting from stimulated radio-chemical reactions. Irregular diffusion and defective doping can also be detected by transition recombinations of $O_2$ and C in the substrate induced by stimulated irradiation. Finally, since inter-metallic formations are related to dislocation of the core structure, modifications in the structure induce effects when a thermal stress is applied, thus enabling inter-metallic formations to be detected.

EXAMPLE 3

Electric excitation of source 4 is used together with isotropic microwave radiation, more particularly millimeter waves in the 30-90 GHz region. This kind of combined excitation can be used to measure photo-induced voltage modifications characteristic of the capacitance. This can be used to trace the variation with time of the electric response supplied to module 5 and in the image detected by transducer 3 to detect the presence of particles of foreign material, irregular diffusion, breaks in the metal coating, or migration of electrons. The millimeter wave detector in the 20-600 GHz region can be a photoconductive detector containing cadmium/mercury telluride monocrystals ($[Hg_{x-1}, Cd_x]Te$) in the hot electron mode. Alternatively the infrared radiation produced by the resistance in series of junctions induced by the excitation currents can be used to detect imperfections in the crystal structure, irregular diffusion and defective doping. The image produced by modules 7 can be compared with the characteristic features of the reference image to show breaks in tracks or conductors, displaced tracks and surface distortion. This kind of excitation can also detect intermetallic formations, since such compounds are associated with dislocation of core structure, and structural modifications induce effects when a thermal stress is applied, superposed on the induced acoustic effects. Irregular diffusion can also be detected by nuclear magnetic resonance (NMR) at the microwave or infrared level. Finally, intermetallic formations and defecting doping agents can both be detected by transition recombinations of $O_2$ and C in the substrate, induced by stimulated irradiation.

EXAMPLE 4

Electric excitation of source 4 is applied together with irradiation by protons. The density of carriers generated by the protons produces thermal waves which scatter around faults and can show imperfections in the crystals, broken or scratched arrays, pores in oxides and breaks therein.

EXAMPLE 5

Electric excitation by source 4 is applied together with a pulsed electron beam, so that the density of carriers generated by the articles produces thermal and electric waves which scatter around faults and reveal imperfections in the crystals, broken arrays, or scratches.

EXAMPLE 6

Electric excitation by source 4 is applied together with neutron irradiation. The luminescence induced by the proportion of charged faults in free-doublet semiconductors can be used to detect imperfections in the crystals, broken arrays, scratches, and irregular diffusion.

EXAMPLE 7

Electric excitation by source 4 is applied together with ion irradiation at 60 keV. Guided propagation of incident ions between layers and between crystal planes produces secondary electrons for detecting imperfections in crystals, broken arrays, scratches, pores in oxides or irregular diffusion.

Ion sources give information about the sub-surface which is not easily accessible to the electron microscope. The only information at a depth is supplied by back-scattering of energetic secondary electrons produced by beams of ions resulting from hard Rutherford diffusion of atomic nuclei into the substrate. Beams of incident ions and emissions of secondary electrons can therefore serve as a sensitive probe of the underlying structure of the target. Cascades of these hard collisions of atomic nuclei in the substrate convey information towards the surface, inter alia at the electron junctions of the integrated circuit. A loss in the channel current (sensitive to the direction of incident ions) in the semiconducting layers of the integrated circuit will produce high-contrast secondary electron images.

As an example of sources of ion bombardment, heavy gallium Ga+ ions having 40 keV energy can be used.

EXAMPLE 8

Electric excitation of source 4 is applied together with an X-ray laser beam. The photo-induced fluorescence stimulated by X-rays can show surface contamination, particles of foreign materials, cracks or scratching in the array, or faults in alignment and in the masks. Breaks in the metal coating are shown by comparing the image and extracting characteristic features depending on the density of optically generated carriers, since the current does not flow or appears at the wrong place, or by correlation of images on the basis of characteristic features thereof.

EXAMPLE 9

Electric excitation by source 4 is applied together with irradiation from a nuclear magnetic resonance (NMR) source, for showing imperfections in crystals, pores in oxides or irregular diffusion.

Figure 3:
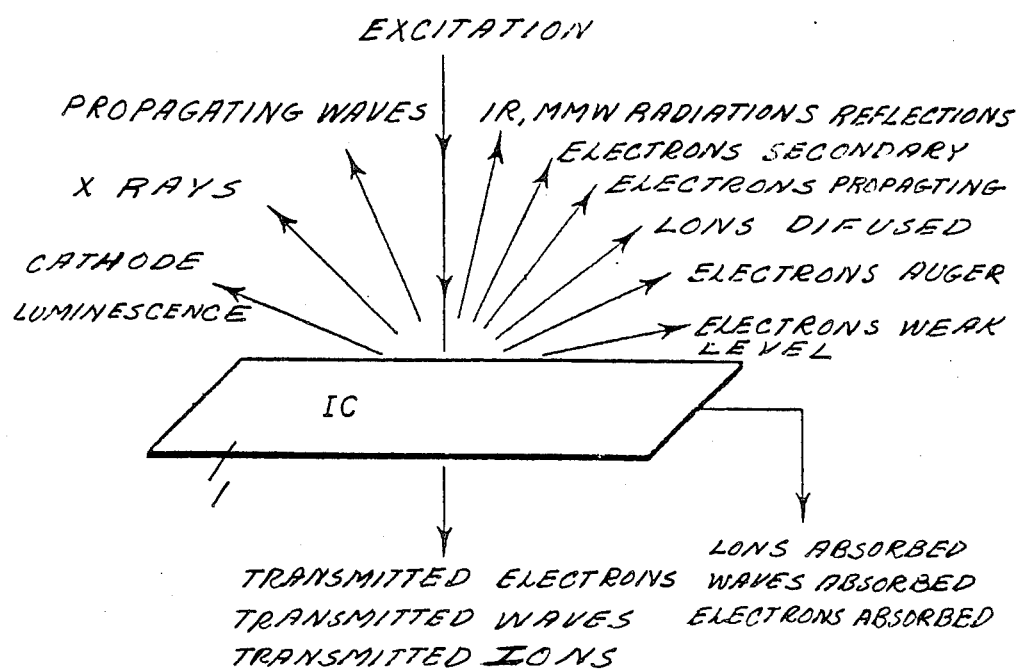
FIG. 3 is a diagram of the types of re-emitted secondary radiation.

FIG. 3 is a diagram of the various kinds of radiation which can be emitted by the electric device under test, depending on the various methods of irradiation used and listed hereinbefore. In connection with FIG. 3, it is important to note that the image can be detected either by reflection or by transparency through the circuit; transparency e.g. in the case of 1.15$\mu$ or laser beam or soft X-rays. In addition the detected radiation (reflected or transmitted) comprises wavelengths $\lambda_d$ other than the wavelength $\lambda_e$ of the exciting radiation, and the wavelengths $\lambda_d$ may be either higher or lower than the excitation radiation. This feature has the two important advantages of eliminating interfering reflection at wavelengths $\lambda_e$ and above all, the fact that the secondary emission is characteristic of transitions at the junctions, so that the spectrum of the wavelengths $\lambda_d$ of these secondary emissions can be used to show the nature of the transitions which produced them, more particularly transitions due to structural faults.

It is to be noted that a scanning electron microscope only gives low-energy of less than 50 eV secondary electrons induced by a primary electron beam. In the case of the invention, photons as well as electrons and secondary ions can be induced, e.g. by an incident laser beam or a beam of ions or millimeter waves.

The diagram in FIG. 3 also shows as secondary radiation the cathode luminescence induced by irradiation by electrons or millimeter waves or laser; such luminescence occurs at certain junctions and also is improperly etched resin.

Figure 4:
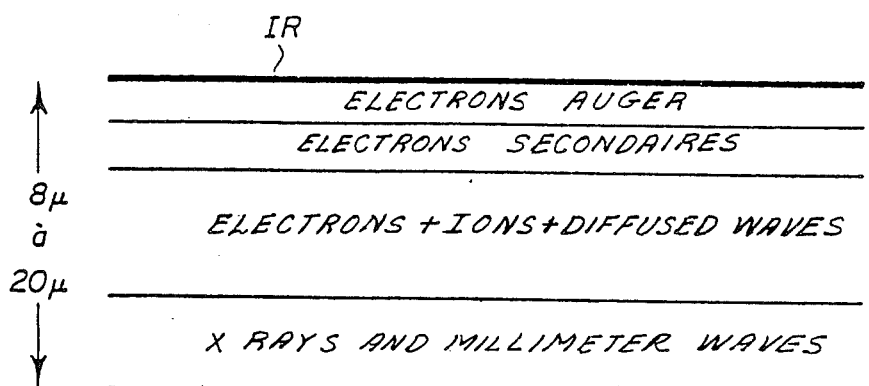
FIG. 4 is a diagram of the primary excitation zones where secondary emission is detected.

The diagram in FIG. 4 shows the depth of the primary excitation zones producing secondary emission for each form of induced radiation.

Secondary emission may occur only at certain values of the voltage applied to the tested circuit, typically for an OR control polarisation voltage or near the blocking voltage, or voltages chosen in dependence on the length of junctions, the properties of the substrates, metal coatings, etc.

The source of radiation 2, and the electric excitation for electrically testing the circuit and produced by source 4, can be synchronized; stroboscopic illumination can be used to block the spatial distribution of voltages and electron charges in selected logic states, connected with electric excitation (in a dynamic and periodic manner).

Figure 2:
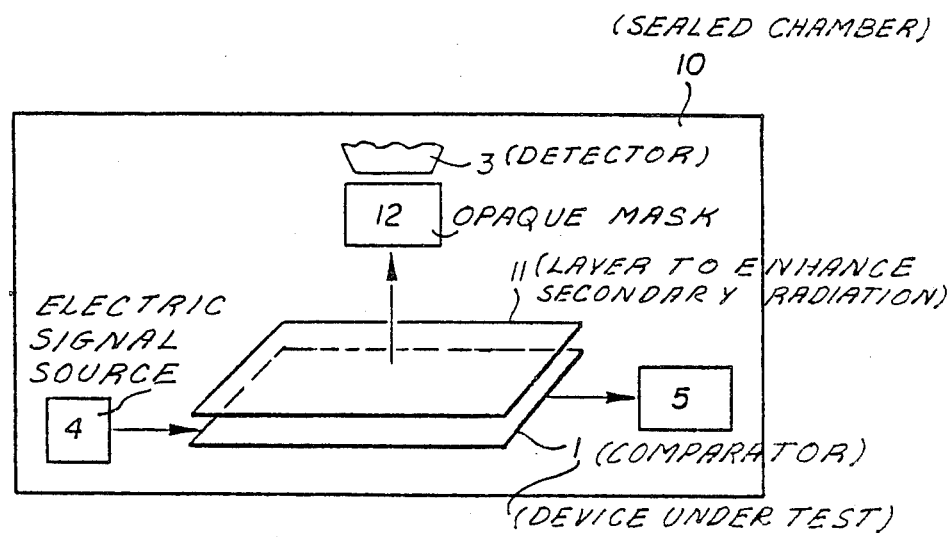
FIG. 2 is a diagram of a variant of FIG. 1.

An opaque mask 12 (FIG. 2) can be placed in front of each detector 3 at the focal point of a lens thereof, to prevent specular reflections of the source 2 on the device 1 from reaching the detectors 3.

The various aforementioned embodiments can be applied under special temperature and pressure conditions of the device under test, and in a special electromagnetic or chemical environment. For example, device 1, source or sources 2 and detector or detectors 3 can be placed in a sealed chamber 10 (FIG. 2) containing a gas in gaseous or liquid state, such as a neutral gas e.g. $N_2$ or $CO_2$ for producing a given chemical medium at a controlled temperature. Hot spots may appear and produce localized evaporation, shown by the formation of bubbles. Chamber 10 can also serve as a barrier for absorbing electromagnetic radiation outside the chamber. It can be supplied with a diffusion or thermomolecular pump.

It is also proposed to deposit a layer 11 (FIG. 2) on device 1 in order to enhance certain secondary radiation $r_e$ emitted by certain zones of device 1 when simultaneously excited by souces 2 and 4 (FIG. 1). For example if layer 11 is made of cholesterol or nematic crystals, detector 3 can be a row or array of three detectors in three respective colours. The liquid crystals in layer 11 can be diluted in pentane with 0.05 to 2% of lecithin. Cholesterol liquid crystals sensitive to the local electric or electrostatic field rotate the polarization plane of the light which they transmit. When hot, the crystals do not rotate polarized light and therefore appear opaque.

The layer 11 (FIG. 2) covering device 1 may also be a transparent substance, e.g. fluorescein diluted in pentane with 0.05 to 2% lecithin, becoming fluorescent when excited by a UV or X-ray laser source as a result of combined electric and photochemical reactions.

Layer 11 may alternatively be a transparent substance such as fluorescein which becomes luminescent when excited by a source 2 such as a source of low-energy neutrons (2–50 eV) owing to the combination of chemical and photochemical reactions.

Layer 21 may also be a liquefied or atomized freon or fluorocarbon, sensitive to local heating of device 1.

Figure 5:
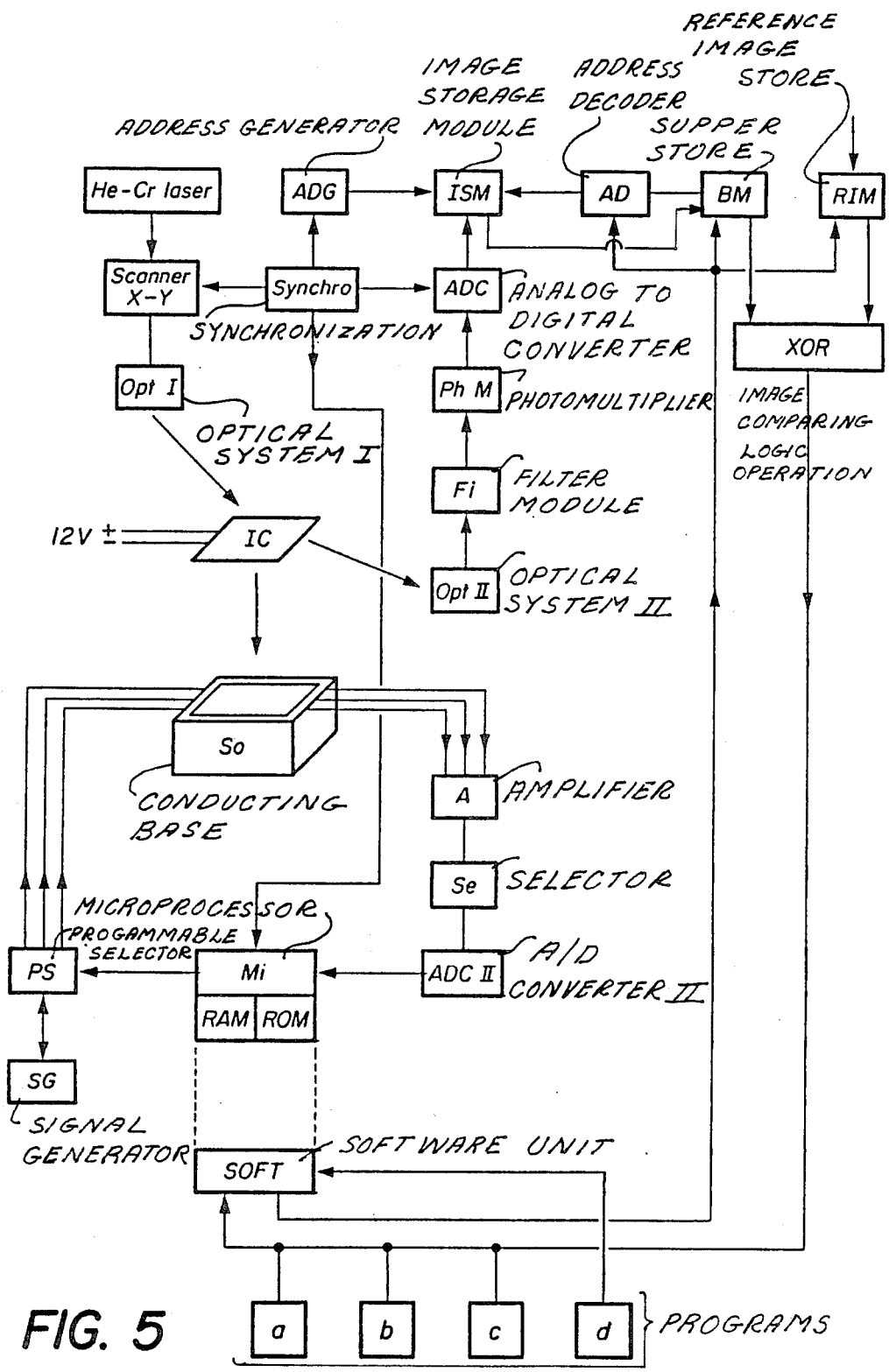
FIG. 5 is a block diagram of a examination (test and injection) unit.

FIG. 5 is a block diagram of an installation which has been used for testing integrated circuits IC.

The irradiation part of the installation comprises a 49 mW HeCr laser producing a monochromatic blue laser beam. The laser is associated with a scanning device (scanner) in an X–Y coordinate system associated with a clock pulse synchronization module (synchro). An optical system (Opt. I) x500–8000 is interposed between the scanner and the integrated circuit IC under test. Circuit IC is connected to a 12 V d.c. electric supply and to a signal generator (SG) by a connecting base (So) on which it is placed during tests. The signals are chosen by a programmable selector (PS) controlled by a 16-bit microprocessor (Mi) connected to the synchro module.

Having described the irradiation components of the installation and the components for electronically stimulating the circuit, we shall now describe the components for detecting secondary radiation and analysing the signals resulting from electric stimulation.

The polychromatic secondary emission resulting from irradiation of circuit IC is picked up by an optical system (Opt. II) x500–8000. The polychromatic radiation is then filtered at a wavelength greater than or equal to 0.480 $\lambda$ in the filter module (Fi) which communicates with a photomultiplier (PhM). The signal is then converted from analog to digital by an 8-bit module (ADC) which supplies the $1024 \times 1024 \times 8$ bit image storage module (ISM) connected to an address generator (ADG) associated with the syncrhonization module (synchro).

Electric signals obtained by electric stimulation by the signal generator (SG) are amplified between 20 and 4000 times by an amplifier (A) connected to an 8-bit analog-digital converter (ADC II) via a selector (Se). The signals from the converter (ADC II) are transmitted to the microprocessor (Mi) and thence to a software unit (SOFT) for analysis together with the processed image coming from an image-comparing logic operation system (XOR).

When the image has been stored in the storage module (ISM) it is processed by system (XOR), which is connected to a reference image store (RIM) and to a buffer store (PM) which in turn is connected to the (ISM) module by an address decoder (AD). The output of system (XOR) transmits detected differences or parts of pre-treated images to the software (SOFT), the processing program of which will be explained hereinafter. The computer then sequentially transfers the image processed by the comparison system (XOR) to the microprocessor image.

The computer program comprises four sequences illustrated by rectangles (a), (b), (c), (d). (a) corresponds to location of faults in the processed image, (b) corresponds to a verification (based on a set of symbolic rules in accordance with the principles of artifical intelligence) of electric faults and faults in the image, (c) corresponds to detection, location and dimensioning of faults and (d) to an instruction for the next electric stimulation test.

In a variant, a first detector 3 can be an infrared scanning detector or an infrared detector comprising an array or row made up of a mosaic of transducers, adapted to detect hot spots, e.g. of about 50° to 60° C. produced by electric excitation and having a spectrum band width in the range from 3 to 7 μm. A second infrared detector (3) having a spectrum band width in the range from 10 to 20 μm is adapted to detect temperature gradients from 0.2° to 0.5° C. for detecting and measuring local intensities in metal coatings and in the conductive connections.

The radiation also induces an electric current which is superimposed on the excitation signal from source 4 and can also reveal discontinuities in the structure. This is one reason why it is proposed to combine the electric response signals from device 1 and the signals from detectors 3 in module 8, the combination being used to evaluate structural defects in device 1. This significantly reduces the duration of the examination. It is also possible to examine deviations due to the image, electric stimulation, or to a combination of these signals. Of course, the images may also be used by an operator reponsible for making such a comparison.

I claim:

1. A method of examining and testing a layered electric circuit device having signal processing capability at discontinuities contained internally of its layers of structure in which radiation emitted by the device itself, after stimulation, is detected by scanning, electric signals characteristic of the detected radiation are formed and the signals are compared with reference signals, said method being characterized in that:

said stimulation of the device comprises, in combination, sending a given electric signal through the device for signal processing therewithin and simultaneously irradiating the device with penetrating radiation from at least one source of radiation of a predetermined type and having predetermined characteristics, the said radiation emitted by the device being the result of interaction of the applied irradiation with the material of the device structure through which the given electric signal travels at places where the structure has discontinuities.

2. A method according to claim 1 characterized in that the radiation emitted by the device is also compared with the expected radiation to be emitted in response to said given stimulating electric signal travelling through the device.

3. A method according to claim 1 characterized in that the irradiation source comprises a pulsed ion laser.

4. A method according to claim 1, characterized in that the irradiation source comprises an infrared source (2–50 microns).

5. A method according to claim 1 characterized in that the irradiation source comprises a millimeter microwave source.

6. A method according to claim 1 characterized in that the irradiation source comprises a proton source.

7. A method according to claim 1 characterized in that the irradiation source comprises a beam of pulsed electrons.

8. A method according to claim 1 characterized in that the irradiation source comprises a neutron source.

9. A method according to claim 1 characterized in that the irradiation source comprises an ion source.

10. A method according to claim 1, characterized in that the irradiation source comprises an X-ray or UV laser.

11. A method according to claim 1 characterized in that the irradiation source comprises a nuclear magnetic resonance (NMR) source.

12. A method according to claim 1 characterized in that the irradiated surface of the device is covered with a liquid substance for locally amplifying the radiation emitted by the surface.

13. A method according to claim 12 characterized in that the substance is a liquid gas.

14. A method according to claim 12 characterized that the substance is made up of liquid crystals.

15. A method according to claim 1 characterized in that at least one of the chemical, electromagnetic and temperature parameters of the device under test is controlled to have a predetermined value.

16. A method according to claim 1 or 2 characterized in that the electric response signals of the electric device are combined in order to compare them with reference signals.

17. A method according to claim 1 characterized by detecting radiation reflected by the device itself after being stimulated.

18. A method according to claim 1 characterized by detecting radiation transmitted through the device itself after stimulation.

19. A method according to claim 4 or 5 characterized by detecting the radiation emitted by the device itself after being stimulated in the millimeter wave region from 20 to 600 GHZ, by using a cadmium/mercury telluride monocrystal photoconduction detector in the hot electron mode.

20. A method for examining and testing an electrical signal processing element having a layered structure of material, said method comprising the steps of:

passing through the said element for processing a predetermined electrical signal;

simultaneously therewith irradiating said element with radiation from at least one radiation source of predetermined type and known characteristics, said irradiation and said electrical signal acting on said element in combination to stimulate said element;

said irradiation interacting with the material of the structure of said element through which said signal is passing at discontinuities present within said structure;

scanning the said element and detecting radiation emanating from said element owing to the said combined stimulation;

forming electrical response signals characteristic of said detected radiation; and comparing said electrical response signals with predetermined reference signals.

21. A method according to claim 20, further comprising the steps of: (1) detecting the processed electrical response signals of the said element to the said stimulating electrical signal travelling through the device, and (2) comparing the said response signals of said element with the expected response to said stimulating electrical signal.

22. A method according to claim 20 characterized by combining the electric response signals of the said element in order to compare them with the reference signals.

23. A method according to claim 20 characterized in that the said detected radiation is radiation emitted by reflection by the said element after being stimulated.

24. A method according to claim 20 characterized in that the said detected radiation is radiation emitted by transmission by the said element after said stimulation.

25. A method according to claim 20 characterized by stimulating the said element by means of irradiation in the millimeter wave region from 20 to 600 GHZ, and detecting the radiation emitted by said element by a cadmium/mercury telluride mono-crystal photoconduction detector in the hot electron mode.

26. A method of examining and testing an integrated, layered electric element having signal processing capability when excited by a supply voltage and suitable input electrical signals, said method comprising the steps of:
applying a supply voltage and a predetermined electrical signal to said element and to a comparison module;
simutaneously irradiating said element with penetrating radiation from at least one radiation source;
detecting secondary radiation emitted by said element and radiation reflected by said element in response to said simultaneous irradiating radiation and electrical excitation of said element;
converting said detected radiation into a stored memory representation characteristic of said electrical element under test;
detecting any faults in said stored memory representation;
comparing an output electrical signal from said element with a reference signal which corresponds to the output electrical signal that said element would produce if said element had no structural defects;
using the information from said comparing step and from said detecting faults step to determine the extent to which said device corresponds to preset standards.

27. A method as in claim 26 wherein the combination of said radiation and said electrical signal stimulating said element causes said radiation to interact with the material of said element through which said signal is passing at the discontinuities present in the structure of said element.

28. A method as in claim 27 wherein a further layer is deposited on said element in order to enhance certain secondary radiation emitted.

* * * * *